United States Patent [19]

Locqueneux

[11] 4,130,828
[45] Dec. 19, 1978

[54] TRIAC STRUCTURE HAVING IMPROVED TRIGGERING SENSITIVITY WITH SINGLE GROOVE EXTENDING FROM GATE REGION

[75] Inventor: René Locqueneux, Paris, France

[73] Assignee: Silec-Semi-Conducteurs, Paris, France

[21] Appl. No.: 891,125

[22] Filed: Mar. 28, 1978

Related U.S. Application Data

[63] Continuation of Ser. No. 732,373, Oct. 14, 1976, abandoned.

[30] Foreign Application Priority Data

Oct. 16, 1975 [FR] France .................. 75 31733

[51] Int. Cl.² .......................................... H01L 29/747
[52] U.S. Cl. ......................................... 357/39; 357/20; 357/55
[58] Field of Search ........................... 357/20, 39, 55

[56] References Cited

U.S. PATENT DOCUMENTS

| | | | |
|---|---|---|---|
| 3,123,750 | 3/1964 | Hutson et al. | 357/39 |
| 3,535,615 | 10/1970 | Howell et al. | 357/39 |
| 3,696,273 | 10/1972 | Foster | 357/39 |
| 3,731,162 | 5/1973 | Suenaga et al. | 357/39 |
| 3,970,843 | 7/1976 | Dumas | 357/39 |
| 3,972,014 | 7/1976 | Hutson | 357/39 |

Primary Examiner—Joseph E. Clawson, Jr.
Attorney, Agent, or Firm—Cushman, Darby & Cushman

[57] ABSTRACT

A new triac structure is provided comprising as a classical triac layers N1 to N4 and P1 and P2, and metallizations A1, G and A2 arranged as indicated in the hereinbelow drawings. The layers N1 and N3 have substantially the same boundary in projection and a groove 10 is formed at the boundary of the layer N3 in order to cross the layer P2. Accordingly, the N1 and N3 regions have no common surface in projection. The triac has substantially the same sensitivity in the four triggering modes.

3 Claims, 4 Drawing Figures

TRIAC STRUCTURE HAVING IMPROVED TRIGGERING SENSITIVITY WITH SINGLE GROOVE EXTENDING FROM GATE REGION

This application is a continuation of my copending application Ser. No. 732,373, filed Oct. 14, 1976, which became abandoned upon the filing hereof.

FIELD OF THE INVENTION

The invention relates to a new structure of triacs.

A triac is a three-electrodes device comprising two main electrodes A1 and A2 and a control electrode or gate G arranged on the same side of the triac of the main electrode A1; such a triac comprises five semi-conductive layers alternatively of the P-type and of the N-type. In a triac, the arrangement of the five layers is such as it can be compared to an integrated circuit comprising two thyristors having opposite conduction directions, the cathode of the first thyristor being connected to the anode of the other and reciprocally, this circuit comprising only one control electrode. This control electrode allows, by injecting a small electric current, to trigger the triac from a blocked state (high impedance) to a conductive state (low impedance) in the two possible conduction directions between the two main electrodes.

Generally, with reference to the potential at the main electrode A1, four operating modes are defined according to the respective polarity of the second main electrode A2 and the gate G with respect to the potential of said first main electrode A1. We shall call first quadrant the case where the electrode A2 is positive with respect to the electrode A1 and third quadrant the case where the electrode A2 is negative with respect to the electrode A1. In each of those two quadrants, two cases occur according to the polarity of the gate with respect to the first main electrode A1. Those four operating modes of a triac will be designated by $I^+$, $I^-$, $III^+$, $III^-$. Those four operating modes are illustrated in the hereunder table.

TABLE

| | Operating mode | Polarity of A2 | Polarity of G |
|---|---|---|---|
| 1st quadrant | $I^+$ | + | + |
| | $I^-$ | + | − |
| 3rd quadrant | $III^+$ | − | + |
| | $III^-$ | − | − |

In a triac, one of the important qualities is precisely this possibility of being triggered according to the four polarization modes. This quality is particularly useful in the industrial applications of the triac, because it permits in particular to trigger a triac with a gate signal having a given polarity whatever the relative polarities of the main electrodes A1 and A2 are. Additionally, it is particularly useful for the triac to have substantially the same sensitivity in the four operating modes, that is the triggering occurs for substantially equal gate current intensity in the four polarization modes.

DESCRIPTION OF THE PRIOR ART

In the prior art triacs, the operating mode $III^+$ (also commonly called − +) has a smaller sensitivity than the other operating modes, i.e. a higher gate current is necessary for triggering the triac.

FIG. 1 schematically shows a classical triac of the prior art. This triac comprises N-type and P-type layers respectively designated by N1, N2, N3, N4 and P1, P2.

The arrangement of said layers is schematically shown in FIG. 1 and will not be disclosed in detail herein as it is well-known from those skilled in the art. The relative arrangement of the layers N3 and N1 will be carefully examined. In order to obtain a triggering in the $III^+$ mode, it has been commonly admitted in the prior art that an overlapping had to exist between the projections of the layers N1 and N3 on a plane parallel to the main surfaces of the triac. Additionally, as seen in the above, this operating mode $III^+$ remains the less sensitive. In order to increase the sensitivity, it has been observed in the prior art that the overlapping surface had to be increased. Said overlapping surface between the projections of the layers N1 and N3 is indicated by (a) in FIG. 1. However, increasing the overlapping surface causes a drawback because, at the same time, the surface of the layer P2 in contact with the metallization of the electrode A2 decreases and according the ability of the triac to withstand high currents decreases in case the electrode A2 is positive.

SUMMARY OF THE INVENTION

Therefore, a main object of the instant invention is to provide a new triac structure allowing a triggering of said triac for substantially equal gate current intensities in the four operating modes of said triac.

A more particular object of the instant invention is to improve the triggering sensitivity of a triac in the $III^+$ mode.

In order to attain those objects and others, the invention provides for forming a groove at the lateral boundary of the layers N3 and P2 of a triac, said groove being substantially centred on the projection of the lateral connection line of the layers N1 and P1.

This and other objects and the features of the instant invention will be apparent from consideration of the following description of a preferred embodiment together with the accompanying drawings, wherein:

DESCRIPTION OF THE PREFERRED EMBODIMENTS

Figures 1, 2:
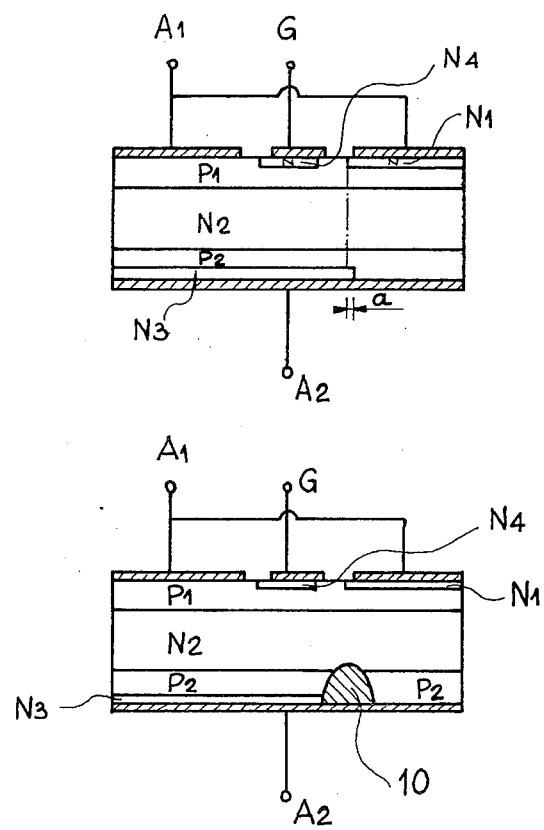
FIG. 1 schematically shows the section of a prior art triac.
FIG. 2 schematically shows the section of a triac according to the invention.

According to the invention, as shown in FIG. 2, a triac is formed substantially in the same way as in the prior art, with the exception that there is no overlapping between the projections of the layers N1 and N3. Additionally, a groove 10 is formed at the lateral limit of the layers N3 and P2, said groove being positioned substantially in correspondence with the projection of the lateral boundary of the layers N1 and P1 of the opposite face of the triac. Preferentially, said groove crosses the layer P2 and enters the layers N2. Surprisingly, the inventor has experimentally established that the formation of such a groove allowed to obtain a triac triggerable in the four operating modes and having additionally a substantially identical triggering sensitivity in the four operating modes and in particular much better than in the prior art as regards the III+ mode. It will be noted that, like FIG. 1, FIG. 2 is schematic and that in fact, the relative thickness of the layers are not the one shown and that, in general, the edges of the triac are grooved in order to form a mesa. Additionally, the edges of the triac and the groove 10 are preferentially provided with a passivating agent.

As an example, the inventor has constructed a classical triac and a triac according to the invention, which were substantially identical at the exception of the configuration of the layer N3 and of the groove in the triac according to the invention. With the classical triac, the gate current intensities allowing the triggering were about 7,7,20 and 40 mA for the operating modes I+, I−, III−, III+, respectively. With the triac according to the invention, the gate current intensities allowing the triggering were about 11, 11, 17 and 17 mA for the operating modes I+, I−, III−, III+ respectively. Those values are average values from a great number of measurements made on theoretically identical triacs.

Additionally, it results from the structure of the triac according to the invention as described in the above that in particular from the fact that there is no overlapping of the layers N1 and N3 in particular in the neighbourhood of the gate region that the (dV/dt) and (dI/dt) switching characteristics of the triac are improved. Indeed, a triac can be considered as the integration of two anti-parallel thyristors which share the same N-type base N2, that is the passage of the current between the first and the second main electrodes in the first quadrant occurs through the thyristor structure N1P1N2P2 and the passage of a current between the first and second main electrodes in the third quadrant occurs through the thyristor structure P1N2P2N3. In operation, at the end of a conductive state for one of the thyristors, the other one is biased in a direction favorable to its triggering. The switching and the conduction from one thyristor to the other are severely limited by the charges stored in the N-type base region N2, shared in the overlapping region of the N-type emmitters regions (N1 and N3) on the opposite sides of the semi-conductive body because, if the (dI/dt) and (dV/dt) switching characteristics are too high, said stored charge will switch the other thyristors structure from the non-conductive state to the conductive state. For those reasons, the switching ability of a prior art triac such as the one shown in FIG. 1 is limited. Said ability is improved according to the instant invention and, in particular, if the peripheries of the outermost N-type emitters regions (N1 and N3) on the opposite sides of the semi-conductive body are separated in order that substantially no overlapping exists.

Figure 3:
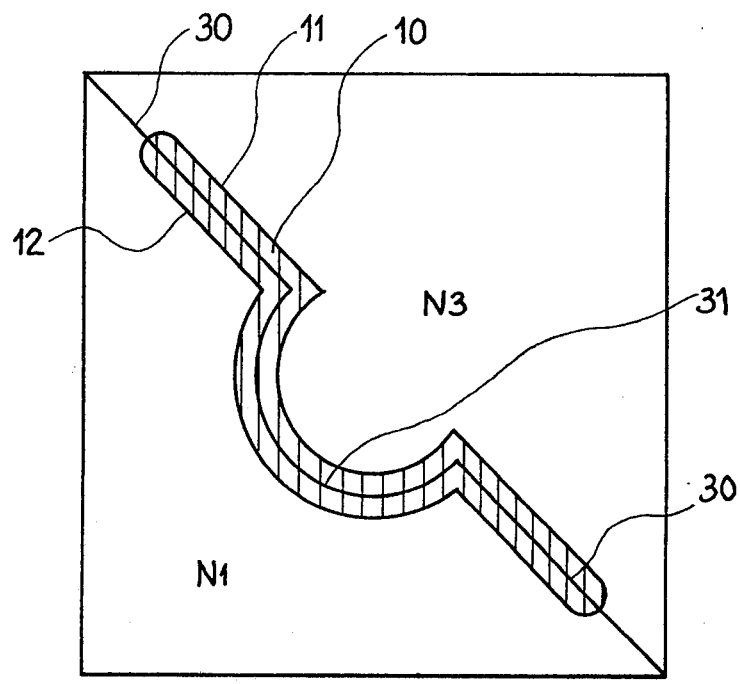
FIG. 3 is an examplary top view of the relative disposition of the layers N1 and N3 and of the groove of a triac according to the invention.
Figure 4:
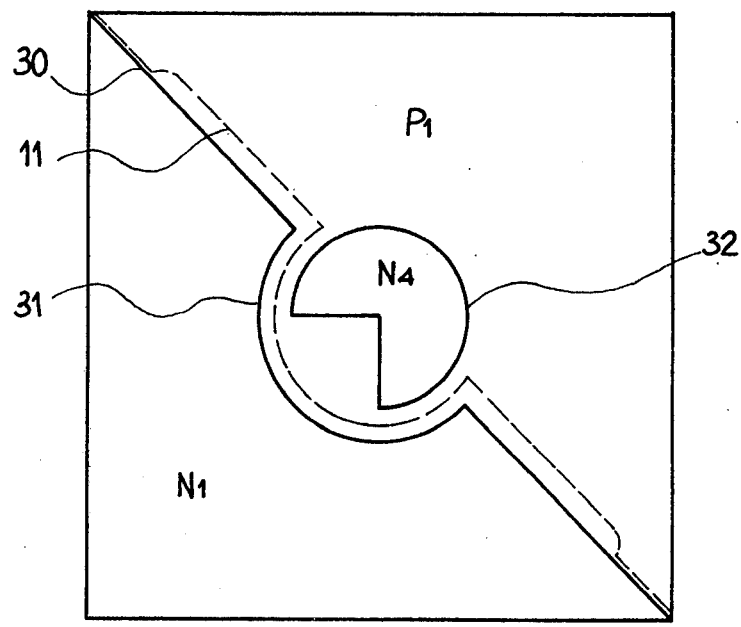
FIG. 4 schematically shows a top view of an embodiment of some layers of a triac according to the invention.

Referring to FIGS. 3 and 4, a specific embodiment of a triac according to the invention will be now described. However, it will be noted that the geometrical arrangement shown in FIGS. 3 and 4 is only indicated as an example and could not be considered as implying a limitation of the instant invention.

FIG. 3 shows the relative arrangement of the layers N1 and N3 on an elementary chip forming a triac. The other layers are not shown for the sake of simplicity. The elementary chip has substantially a square shape and the layers N1 and N3 have complementary forms separated in projection by a substantially diagonal boundary line 30. Said substantially diagonal line 30 is deviated according, for example, to a circle, in the neighbourhood of the center of the chip, in the case shown in the Figure wherein the gate is centrally positioned. Said deviation is indicated by the reference 31. The groove 10, shown on FIG. 2, is allowed at the limit of the layer N3 and follows substantially said boundary line 30-31. In FIG. 3, the groove does not extend till the ends of the diagonal 30, however, this constitutes only an example and the groove could go on until the opposite corners of the chip. The reference 11 indicates the limit of the groove on the side arranged above the diagonal and the reference 12 the limit of the groove on the side arranged under the diagonal 30. The N3 layer will be limited by the line 11 and the remaining parts of the diagonal 30 while the region N1 will be limited by the boundary line 30-31. Accordingly, there is no overlapping between the projection of the N1 and the N3 layers and, on the contrary, a separation between the projections of said layers.

FIG. 4 shows a top view of the triac according to the invention, said triac not being provided with electrodes. In this top view one can see the P1 and N1 regions separated by the boundary 30–31 and the N-type gate region N4, limited by a line 32. As usual, said N4 region is substantially disk-shaped, said disk being notched in order that the central electrode which shall form the gate contact lies on the one hand over the N4 layer, and on the other hand on a part of the P1 layer. FIG. 4 also shows the line 11 which marks the boundary of the N3 layer, said boundary being under the projection of the P1 layer.

The classical various improvements to the triac, that is in particular, the formation of emitter short circuit in the N1 and N3 regions, grooving and passivations, can be made in connection with the triac according to the invention.

Electrodes are classically arranged on the triac chip of the invention, that is a first central metallization will cover a part of the N4 layer and a part of the P1 layer, a second annular metallization will cover a part of the N4 layer and a part of the P1 layer, a second annular metallization will cover the greatest part of the N1 and P1 layers and a third metallization will cover all the lower face of the triac chip, that is the layers N3 and P2.

Of course, all the conductivity types of the various layers have been given as an example and could be inverted.

It will be understood that a specific embodiment of a triac having a central gate has been disclosed. Of course the invention also applies to the triacs having a gate arranged in a corner thereof.

The present invention is not limited to the embodiments which have been described and other variants and modifications may be provided without departing from the scope of the invention.

What is claimed is:

1. A triac triggerable according to the four polarization modes by substantially equal gate current intensities in the four modes comprising:
   a first P-type semi-conductive layer (P1)
   a second N-type semi-conductive layer (N2)
   a third P-type semi-conductive layer (P2)
   a first N-type region (N4) coated on a small area part of the first P-type layer (P1) and serving as a single gate for the triac,
   a second N-type region (N1) coated on a relatively large surface of the first P-type layer (P1) and not connecting the first N-type region (N4), the second region (N1) and the first layer (P1) presenting, in a top view, a first boundary line, a third N-type region (N3) coated on a relatively large surface of the third P-type layer (P2), and presenting a second boundary line therewith, the improvement being that the projections of the first and second boundary lines on a plan parallel to the plan of the layers are substantially similar, the second and third N-type regions (N1) and (N3) lying, in projection, in substantially complementary regions, and a single groove being formed from the surface comprising the third region (N3), said single groove being substantially centered on said boundary lines and extending from the side of the triac opposite the side in which the gate is formed.

2. A triac according to claim 1 wherein the N and P conductivity types are interchanged.

3. A triac according to claim 1 characterized in this that the groove crosses the third P-type layer (P2) and enters the second N-type layer (N2).